(12) United States Patent
Rey et al.

(10) Patent No.: US 9,239,414 B2
(45) Date of Patent: Jan. 19, 2016

(54) OBJECT PROVIDED WITH A GRAPHIC ELEMENT TRANSFERRED ON A SUPPORT AND METHOD FOR MAKING SUCH AN OBJECT

(75) Inventors: Alain-Marcel Rey, Mours St Eusebe (FR); Jean-Frederic Clerc, Brie et Angonnes (FR); Alain Soubie, Saint Egreve (FR); Laurent Vandroux, Le Cheylas (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 357 days.

(21) Appl. No.: 12/863,314

(22) PCT Filed: Jan. 23, 2009

(86) PCT No.: PCT/EP2009/050779
§ 371 (c)(1),
(2), (4) Date: Jul. 16, 2010

(87) PCT Pub. No.: WO2009/092794
PCT Pub. Date: Jul. 30, 2009

(65) Prior Publication Data
US 2010/0310839 A1 Dec. 9, 2010

(30) Foreign Application Priority Data

Jan. 25, 2008 (FR) ..................................... 08 50475

(51) Int. Cl.
*B44C 1/04* (2006.01)
*G02B 5/18* (2006.01)
*B44C 1/22* (2006.01)
*H01L 21/762* (2006.01)
*A44C 15/00* (2006.01)

(52) U.S. Cl.
CPC ................ *G02B 5/1857* (2013.01); *B44C 1/04* (2013.01); *B44C 1/228* (2013.01); *H01L 21/76254* (2013.01); *A44C 15/004* (2013.01); *Y10T 428/24868* (2015.01)

(58) Field of Classification Search
None
See application file for complete search history.

(56) References Cited

U.S. PATENT DOCUMENTS

| 4,425,769 A | 1/1984 | Hakoune |
| 5,552,628 A | 9/1996 | Watanabe et al. |

(Continued)

FOREIGN PATENT DOCUMENTS

| EP | 0 064 780 A1 | 11/1982 |
| EP | 0 450 558 A2 | 10/1991 |

(Continued)

OTHER PUBLICATIONS

EPO Partial Tranlastion of FR2839623.*

(Continued)

*Primary Examiner* — Mark Ruthkosky
*Assistant Examiner* — Laura C Powers
(74) *Attorney, Agent, or Firm* — Oblon, McClelland, Maier & Neustadt, L.L.P.

(57) ABSTRACT

An object including at least one graphic element, including at least one at least partly transparent substrate, at least one face of which includes recesses forming a pattern of the graphic element filled with the at least one material, the face of the substrate being fixed to at least one face of at least one support by wafer bonding, the substrate and the support forming a monolithic structure.

12 Claims, 6 Drawing Sheets

(56) References Cited

U.S. PATENT DOCUMENTS

| | | | |
|---|---|---|---|
| 5,972,233 A * | 10/1999 | Becker et al. | 216/28 |
| 6,025,060 A * | 2/2000 | Meissner | 428/220 |
| 6,117,689 A * | 9/2000 | Summerfelt | 438/3 |
| 6,974,759 B2 | 12/2005 | Moriceau et al. | |
| 6,991,995 B2 | 1/2006 | Aulnette et al. | |
| 7,494,897 B2 | 2/2009 | Fournel et al. | |
| 7,807,482 B2 * | 10/2010 | Aspar et al. | 438/15 |
| 2002/0022337 A1 * | 2/2002 | Maleville et al. | 438/406 |
| 2012/0111829 A1 | 5/2012 | Deguet et al. | |
| 2014/0318906 A1 | 10/2014 | Deimerly et al. | |

FOREIGN PATENT DOCUMENTS

| | | |
|---|---|---|
| EP | 0 450 558 A3 | 10/1991 |
| EP | 0 627 763 A1 | 12/1994 |
| EP | FR 2 850 487 A1 | 7/2004 |
| EP | FR 2 855 908 A1 | 12/2004 |
| EP | 1 544 178 A1 | 6/2005 |
| FR | 2 816 445 A1 | 5/2002 |
| FR | 2839623 A1 * | 11/2003 |
| FR | 2 851 496 A1 | 8/2004 |
| FR | 2 888 402 A1 | 1/2007 |
| JP | 07-044934 | 12/1995 |
| JP | 2006-082097 | 3/2006 |
| JP | 2007-243047 | 9/2007 |
| JP | 2007-329156 | 12/2007 |
| WO | WO 99/55188 | 11/1999 |
| WO | WO 2005124826 A1 * | 12/2005 |

OTHER PUBLICATIONS

Full Translation of FR 2839623, "Jewel and Manufacturing Method Thereof"; Cardone, Claude; Nov. 21, 2003.*
International Search Report issued Jul. 29, 2009, in PCT/EP2009/050779.
Preliminary Search Report issued Nov. 5, 2008, in France Patent Application No. FA 705036.
U.S. Appl. No. 12/812,561, filed Jul. 12, 2010, Rey, et al.
Kim, T.H., et al., "Wafer-Scale Surface Activated Bonding of Cu—Cu, Cu—Si, and Cu—$SiO_2$ at Low Temperature", Electrochemical Society Proceedings vol. 2003-19, pp. 239-247 (2003).
Tong, Q.Y., "Principles of Wafer Bonding", Silicon Wafer Bonding Technology for VLSI and MEMS Applications, The Institution of Electrical Engineers, pp. 1-20 (2002).
Takagi, Hideki et al., "Direct Bonding of Two Crystal Substrates at Room Temperature by Ar-beam Surface Activation", Journal of Crystal Growth, pp. 429-432 (2006).

* cited by examiner

OBJECT PROVIDED WITH A GRAPHIC ELEMENT TRANSFERRED ON A SUPPORT AND METHOD FOR MAKING SUCH AN OBJECT

TECHNICAL FIELD

The invention relates to an object, such a massive object, for example of the jewel, stone, watch type (for example a watch glass, a dial or a case bottom), a mobile electronic equipment (for example a window or a screen) or any other solid medium, including a graphic element, graphics, such as a decoration, typographic characters, a drawing or a further a photograph, for example with micrometric and/or nanometric dimensions. The invention also relates to a method for making such an object.

The invention finds applications in various industrial, cultural or artistic fields. For the watch industry, watch glasses or case bottoms may be made according to the invention in order to produce very robust graphics or semi-transparent decorations of very high visual quality.

The invention may also be applied in the field of jewelry, notably for producing stones including decorations or texts with micrometric and/or nanometric dimensions, for example used for making pendants, rings, or earrings.

The invention may also be used for achieving the storage of a large amount of information in small volumes (for example a few cm² of surface area for less than 2 mm of thickness) with very good durability (several thousand or million years).

PRIOR ART

Making objects including decorations or graphics with micrometric size obtained by applying techniques from microtechnologies, for example by photolithography on an object is known. However the durability and the mechanical robustness of these decorations made on the surface of objects are generally poor.

A method for protecting graphics made on an object is described in document FR 2 851 496. In this document, the graphics are first made by photolithography on a transparent substrate. The substrate is then turned over and then fixed onto the desired object by adhesive bonding or crimping.

Such a method has several drawbacks. Indeed, the adhesives used for fixing the substrate onto the object include organic materials having limited lifetime. The thereby produced objects therefore have limited lifetime. On the other hand, the optical properties of these adhesives are degraded over time which alters the legibility of graphics made on the substrate. Crimping allows solid mechanical assembling of the substrate to the object, but does not ensure good integrity of the object and of its graphics since the achieved crimping may be disassembled without destroying the object, which poses a problem if it is desired to make an object including tamperproof graphics.

DISCUSSION OF THE INVENTION

An object of the present invention is to propose an object including one or more graphic elements, as well as a method for making such an object, not having the drawbacks of the prior art as described earlier.

For this, the present invention proposes an object provided with at least one graphic element, including at least one at least partly transparent substrate, at least one face of which comprises recesses forming a pattern of the graphic element filled with at least one material, said face of the substrate being fixed to at least one face of at least one support by molecular adhesion, the substrate and the support forming a monolithic structure.

Thus, the graphic element, which may have micrometric and/or nanometric dimensions, formed by the material positioned in the recesses, is made on the object in a robust, durable and integral way (detachment is impossible without degrading the object) by means of bonding by molecular adhesion achieved between the substrate and the support of the object.

The graphic (s) or text(s), formed by the graphic element, are therefore hermetically sealed between two massive solid components, the substrate on one side and the support on the other, by means of the achieved bonding by molecular adhesion. This hermetic seal notably forms a barrier to diffusion of humidity or of any gas or liquid chemical product (except for products which may be capable of destroying the substrate or the support).

With bonding by molecular adhesion, it is possible to form a monolithic structure from the substrate and from the support of the object, in which the graphic element is enclosed. When the substrate and the support are of the same nature, a massive crystal is then reconstructed, for example without any interface between the support and the substrate, with a graphic element embedded into the crystal. The adhesion forces between the substrate and the support are greater than the cohesion forces of the materials. Thus, any attempt to detach the substrate would lead to destruction of the object.

The graphic element is mechanically protected by the whole thickness of the substrate on one side and by the whole thickness of the support on the other. The substrate and/or the support have to be abraded or integrally worn away before being able to destroy the graphic element. This protection may therefore be maximized by selecting very hard materials, for example sapphire for the substrate which can only be scratched by silicon carbide or diamond.

For example by selecting a substrate and/or a support composed of sapphire, the melting temperature of which is equal to about 1,790° C., and a material, positioned in the recesses and forming the graphic element, composed of platinum, the melting temperature of which is equal to about 1,768° C., an object is obtained which has high resistance to thermal aggressions (for example to fire), and therefore excellent durability.

With bonding by molecular adhesion achieved between two materials of the same nature, it is possible to avoid any risk of potential ageing of the assembly by mechanical fatigue induced by differential heat expansions of other additional materials.

Further, with bonding by molecular adhesion, it is possible to use mineral materials, the optical properties of which are stable over time. The produced structure therefore does not undergo any degradation of its optical properties (notably the visibility of the graphic element) due to time.

When the support is a precious or semi-precious stone and the substrate is composed of the same material as the support, it is thus possible to re-form a massive stone, notably when no other material is used for the bonding by molecular adhesion, including the graphic element made inside, i.e. <<embedded>> in the stone.

Further, this object may be made independently of the density of the patterns of the graphic element.

When the graphic element is made from a metal material positioned in the recesses, the graphics or texts therefore may be produced with a precious and very stable material, i.e. insensitive to corrosion and to degradations over time.

Further, patterns with micrometric dimensions made on objects, such as precious stones, may be totally invisible to the naked eye. It is thus possible to have totally discreet traceability of the object, for example giving the possibility of fighting against counterfeit and theft of the object.

The material positioned in the recesses may be composed of at least one mineral material, for example a metal, and/or the substrate may be composed of at least one amorphous or crystalline material.

The object may further include an adherence material positioned in the recesses, between the material also positioned in the recesses and the substrate.

The adherence material may be composed of at least one metal and/or on a metal nitride and/or a metal oxide.

The object may further include at least one first adhesion layer and/or at least one second adhesion layer positioned between the face of the substrate including the recesses and the support, the molecular adhesion may be formed between the first adhesion layer and the support, or between the second adhesion layer and the face of the substrate including the recesses, or between the first adhesion layer and the second adhesion layer.

By the first and/or the second adhesion layer which may made on the substrate and/or on the support before the bonding by molecular adhesion, the substrate and/or the support may be of any nature or composed of any material, for example of the solid mineral type.

The first adhesion layer and/or the second adhesion layer may be composed of at least one mineral material.

When the material positioned in the recesses is composed of metal, said material may include an area composed of said metal and of a semiconductor at a face of the material opposite to another face of the material located on the side of the recesses. For example, said area may be composed of silicide. Thus, the adherence of the adhesion layer with the material positioned in the recesses is improved.

The substrate may include a thin at least partly transparent layer, a face of which may be said face of the substrate including the recesses and fixed to the support by molecular adhesion.

Here and in all the remainder of the document, by thin layer is meant a layer for which the thickness is less than about 10 µm.

A thin layer may thus be obtained on which a graphic element is made and transferred onto a support, for example a thicker precious stone, i.e. the thickness of which is for example equal to at least one millimeter or greater than about 100 µm. In this case, the thin layer therefore represents relatively to the total thickness of the object, a minimal thickness, for example one thousandth, or less, of the total thickness of the object.

The object may be a jewel, a stone, a watch, an electronic device or a data medium.

The invention also relates to a method for making an object provided with at least one graphic element, including at least the steps of:
  a) etching at least one face of an at least partly transparent substrate according to a pattern of the graphic element, forming recesses in said face,
  b) depositing at least one material at least in the recesses formed in the face of the substrate,
  c) fixing the face of the substrate including the recesses to at least one face of at least one support by molecular adhesion, the substrate and the support forming a monolithic structure.

The deposition step b) may be achieved by applying a step for depositing a layer composed of the material onto the face of the substrate including the recesses and into the recesses, and a step for mechanochemical polishing of said layer composed of the material with stop on the face of the substrate, only letting material portions of said layer, positioned in the recesses, subsist.

In an alternative, the deposition step b) may be achieved by applying a step for filling the recesses by screen-printing, the material positioned in the recesses may include a metal-loaded paste or ink, and a step for drying the material. In this case, the method may further include after this step for drying the material positioned in the recesses, a step for mechanochemical polishing of the face of the substrate, by which this face of the substrate may be cleaned and treated.

The method may further include, between the etching step a) and the step b) for depositing the material in the recesses, a step for depositing an adherence material in the recesses so that the adherence material partly fills the recesses, the other material may then be deposited on the adherence material during step b).

The step for depositing the adherence material may be obtained by applying a step for depositing a layer composed of the adherence material onto the face of the substrate including the recesses and into the recesses, the deposition step b) may be achieved by applying a step for depositing a layer composed of the other material on the layer composed of the adherence material and a step for mechanochemical polishing of said layers composed of the adherence material and the other material with stop on the face of the substrate, only letting material portions of said layers, positioned in the recesses, subsist.

The method may further include, between the deposition step b) and the fixing step c), a step for depositing an adhesion layer onto the face of the substrate including the recesses, which may also cover the material(s) positioned in the recesses, the fixing step c) may be achieved by applying bonding by molecular adhesion between said adhesion layer and the support.

In this case, the method may further include, between the step for depositing the adhesion layer onto the face of the substrate including the recesses and the fixing step c), a step for mechanochemical polishing of the adhesion layer deposited onto the face of the substrate including the recesses.

In one alternative, the method may further include, before the fixing step c), a step for depositing an adhesion layer onto the face of the support, the fixing step c) may be achieved by applying bonding by molecular adhesion between the adhesion layer and the face of the substrate including the recesses.

In another alternative, the method may further include:
  between the deposition step b) and the fixing step c), a step for depositing a first adhesion layer onto the face of the substrate including the recesses, which may also cover the material(s) positioned in the recesses,
  before the fixing step c), a step for depositing a second adhesion layer onto the face of the support,
  the fixing step c) may be achieved by applying bonding by molecular adhesion between both adhesion layers.

The method may further include, when the material deposited in step b) is composed of metal, between the deposition step b) and the step for depositing the adhesion layer, a step for forming an area composed of said metal and of a semiconductor at a face of the material opposite to another face of the material located on the side of the recesses.

In this case, the step for forming said area may be achieved by applying a step for siliconizing the material deposited in the recesses.

The method may further include, between the step for depositing the adhesion layer onto the face of the support and the fixing step c), a step for mechanochemical polishing of the adhesion layer deposited on the support.

The step a) for etching the face of the substrate may be achieved by applying masking, lithographic and etching steps in the face of the substrate, or at least one laser ablation step directly in the face of the substrate.

The method may further include, before the etching step a), a step for making a thin at least partly transparent layer on a massive substrate, which may form the at least partly transparent substrate, and a step for making a fracture interface between the thin layer and the massive substrate, the recesses formed in the etching step a) may be made in a face of the thin layer, and may further include, after the fixing step c), a fracture step between the thin layer and the massive substrate, at the fracture interface; the monolithic structure may be formed by the thin layer and the support.

Thus, it is possible to handle thin or very thin films, for example with a thickness of less than about 10 μm or less than about 1 μm, including patterns of graphic elements and to bond them onto a massive support, for example a precious or semi-precious stone. Graphics are thereby made without any physical or geometrical modification of the object.

The thin layer may be made by CVD (chemical vapor deposition), for example PECVD (plasma-enhanced chemical vapor deposition), MOCVD (metal organic chemical vapor deposition) or ALCVD (atomic layer chemical vapor deposition), or PVD (physical vapor deposition, i.e. evaporation or cathode sputtering) on the massive substrate, and/or the fracture interface may be made by ion implantation.

In one alternative, the method may further include, before the etching step a), a step for making a fracture interface in the substrate, a first portion of the substrate being able to form a thin at least partly transparent layer and a second portion of the substrate being able to form a massive substrate, the fracture interface may be positioned between both portions of the substrate, the recesses formed in the etching step a) may be made in a face of the thin layer, and may further comprise after the fixing step c), a fracture step between the thin layer and the massive layer at the fracture interface, the monolithic structure being able to be formed by the thin layer and the support.

The method may further include, after the fixing step c), a step for heat treatment of the object which may consolidate the molecular adhesion.

SHORT DESCRIPTION OF THE DRAWINGS

The invention will be better understood upon reading the description of exemplary embodiments given purely as an indication and by no means as a limitation, with reference to the appended drawings wherein.

Identical, similar or equivalent portions of the different figures described hereafter bear the same numerical references so as to facilitate passing from one figure to the other.

The different portions illustrated in the figures are not necessarily illustrated according to a uniform scale, in order to make the figures more legible.

The different possibilities (alternatives) should be understood as not being exclusive of each other and may be combined with each other.

DETAILED DISCUSSION OF EMBODIMENTS OF THE INVENTION

A method for making an object 100 including a graphic element transferred onto a support 20, for example a massive object such as a jewel, a watch, an electronic equipment, or further a medium for keeping information, will be described in connection with FIGS. 1A-1I. In the first embodiment, the object 100 is a medium for keeping information, or a data medium, the graphic element of which are data which one wishes to keep.

Figure 1A:
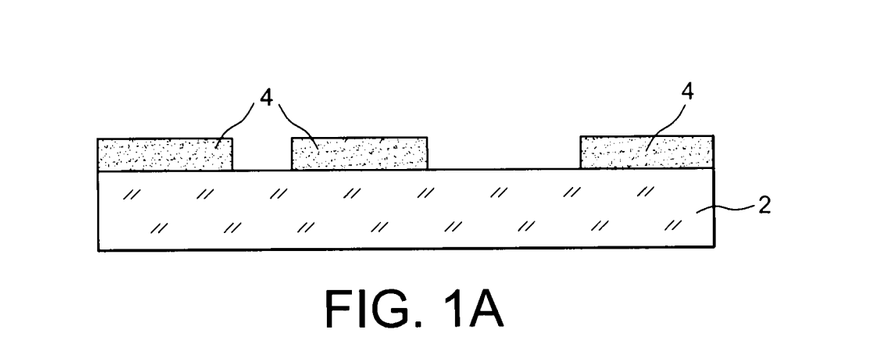
FIGS. 1A-1I illustrate the steps of a method for making an object provided with a graphic element, according to a first embodiment of the present invention.

As illustrated in FIG. 1A, a mask 4, the pattern of which corresponds to that of the graphic element to be made, is first of all made on one face of a for example transparent or at least partly transparent substrate 2 composed of an amorphous material such as glass, or a crystalline material such as sapphire or diamond. For this, a photosensitive resin layer is for example deposited on the substrate 2. One or more lithography and etching steps are then applied in order to form the mask 4. In the exemplary embodiment described here, the mask 4 is therefore formed by remaining portions of the photosensitive resin layer deposited on the substrate 2. The photosensitive resin layer is therefore directly used in order to form the etching mask 4. In the example described here, the photosensitive resin is negative, the pattern of the graphic element being formed by the portions of the mask 4. However, it is also possible to use a positive photosensitive resin. The thickness of the substrate 2 is for example equal to a few hundred micrometers, or comprised between about 100 μm and 1 mm. The thickness of the support 20 (illustrated in FIGS. 1G-1I) may notably be greater than or equal to the thickness of the substrate 2.

Figure 1B:
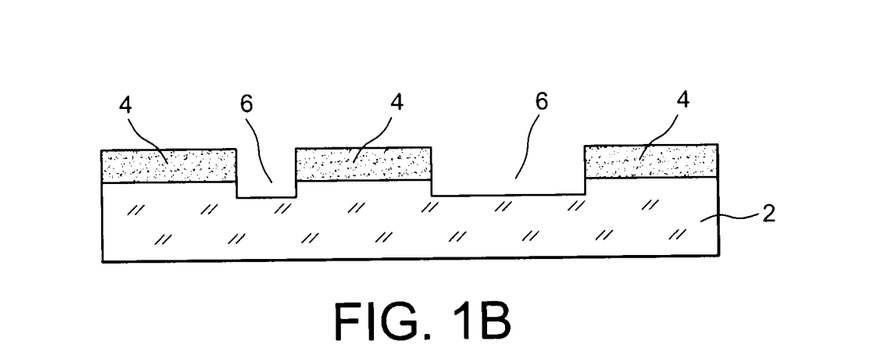

As illustrated in FIG. 1B, the face of the substrate 2 on which the mask 4 is made, is then etched via an isotropic or anisotropic or dry chemical route (plasma mode, reactive ion etching or ion machining) forming recesses 6, the pattern of which complies with that of the graphic element. The etching mask 4 is then removed. The pattern of the graphic element is therefore transferred into the substrate 2.

In an alternative embodiment, the mask 4 may be formed in a layer, for example of the mineral type, (for example composed of silicon dioxide) or composed of metal, first of all deposited on the substrate 2, and onto which the layer composed of photosensitive resin is then deposited. The pattern of the graphic element is then formed by lithography and etching in the resin layer. This pattern is then transferred into the mineral or metal layer by etching. Finally, the remaining portions of the resin layer are then removed by etching. The mask 4 is in this case formed by the remaining portions of the mineral or metal layer. This alternative may notably be used for making an etching mask which withstands certain etching agents, used for etching the substrate 2, which may damage a mask composed of resin (for example, aqua regia). The selection of either alternative embodiment of the mask may be made depending on the material to be etched (material of the substrate 2).

In another alternative method, it is possible not to use any etching mask. In this case, the pattern of the graphic element is directly transferred into the substrate 2, for example by laser ablation, with a femtosecond laser.

A deposit is then made on the face etched previously of the substrate 2, of an adherence layer 12, as well as in the recesses 6 made previously. A layer 14 is then deposited on the adherence layer 12 (see FIG. 1C). The layers 12 and 14 are for example obtained by depositions of the PVD type. In this first embodiment, the layer 14 is composed of metal, for example gold, platinum, tungsten, titanium, metal oxide, etc. Generally, the layer 14 may also be composed of at least one mineral material. This material may notably be opaque to light. The thickness of this layer 14 is for example comprised between about 50 nm and 100 nm. The thickness of the layer 14 may notably be selected depending on the nature of the material forming the layer 14, the selected thickness being sufficient for obtaining a certain opacity of the layer 14. Further, the sum of the thicknesses of the layers 12 and 14 is here greater than the depth of the recesses 6 made in the substrate 2.

Figure 1C:
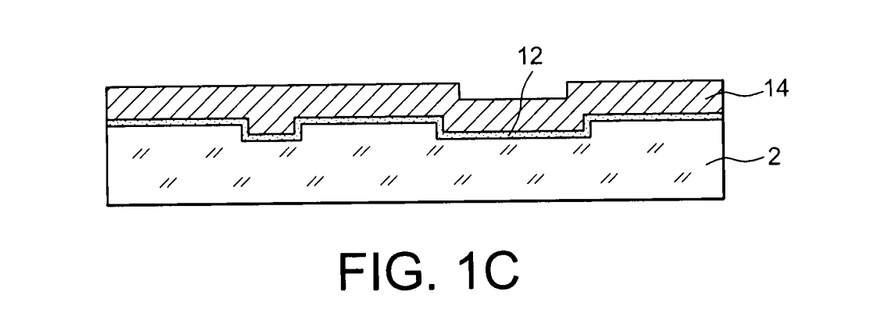

Thus, given that the graphic element which one wishes to produce is formed by the portions of the layers 12 and 14 positioned in the recesses 6, the graphic element will be visible through the substrate 2 on the object 100, the opacity of the material of the layer 14 allowing the made graphic element to visually stand out. The adherence layer 12 is for example composed of titanium, titanium nitride, titanium oxide or any other material with which good adherence may be obtained between the layer 14 and the substrate 2. The nature of the adherence layer 12 may notably selected depending on the nature of the substrate 2 and of the layer 14. The thickness of this adherence layer 12 may for example be comprised between about 1 nm and 10 nm.

Figure 1D:
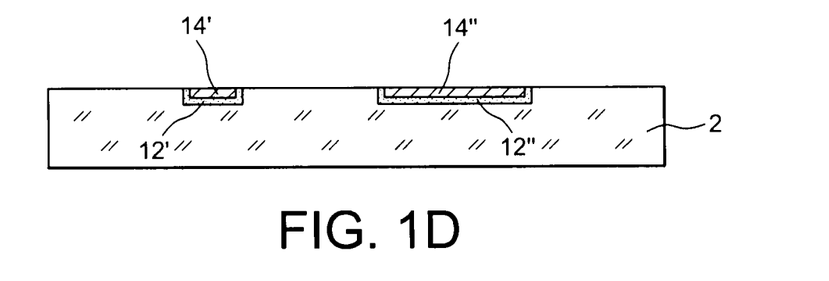

As illustrated in FIG. 1D, mechanochemical polishing of the layer 14 and of the adherence layer 12 is then carried out with stop on the face of the substrate 2 on which the layers 12 and 14 have been deposited. Portions 12', 12" of the adherence layer 12 and portions 14', 14" of the layer 14 positioned in the recesses already made in the substrate 2 are thus preserved. These remaining portions 12', 12" and 14', 14" therefore form the pattern of the graphic element which one wishes to make.

Figure 1E:
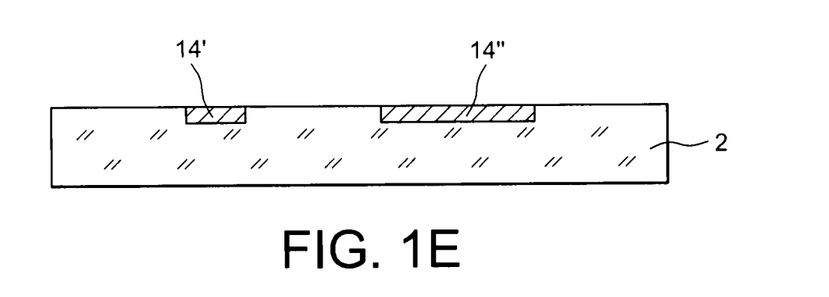

In an alternative, the layer 14 may be deposited on the substrate 2 and in the recesses 6 formed in the substrate 2 without depositing beforehand any adherence layer 12 on the substrate 2. The thickness of the deposited layer 14 may in this case be greater than the depth of the recesses 6. As described earlier, mechanochemical polishing of the deposited layer 14 is then carried out in order to only retain the portions 14', 14" deposited in the recesses 6 (FIG. 1E). In this alternative, the layer 14 may be composed of an ink or a paste loaded with metal and directly deposited in the recesses 6 of the substrate 2 by screen-printing. The deposited ink or paste is then dried before carrying out mechanochemical polishing.

It is also possible to make, for example by photolithography and etching, at least one cavity in the substrate 2 and/or the portions 14', 14", at the face of the substrate 2 including the recesses 6. One or more micro-objects may then be positioned in this cavity or these cavities.

Figure 1F:
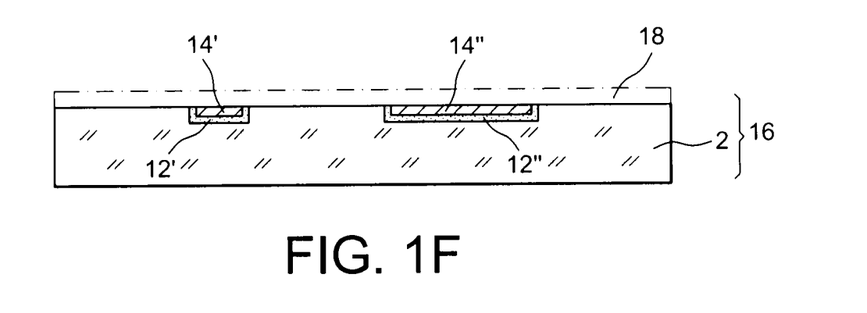

In FIG. 1F, an adhesion layer 18 is then deposited, for example by CVD or PVD, onto the face of the substrate 2 including the portions 12', 12", 14', 14" deposited in the recesses. This adhesion layer 18 is for example composed of a mineral material, such as silicon dioxide or silicon nitride. The material of this adhesion layer 18 is notably selected so as to be able to subsequently achieve bonding by molecular adhesion with the support 20. This adhesion layer 18 is also intended to ensure a protection of the pattern formed by the remaining portions 14', 14" of the layer 14.

When the remaining portions 14', 14" of the layer 14 are composed of metal, it is possible to form in these remaining portions 14', 14", prior to depositing the adhesion layer 18, a metal-based and semiconductor-based area of the layer 14. This area may for example be formed by siliconizing the remaining portions 14', 14". This siliconizing is for example obtained by decomposition of silane ($SiH_4$, or more generally any gas of the $Si_nH_{2n+2}$ type) under a controlled atmosphere, at a temperature for example comprised between about 200° C. and 450° C. and preferably equal to about 300° C. The thereby decomposed gas reacts with the metal of the portions 14', 14" in order to form the area composed of metal and of semiconductor at the surface of the portions 14', 14". For example, when the portions 14, 14" are composed of Pt, the area obtained after siliconizing is then composed of PtSi. It is also possible that this area formed at the surface of the portions 14', 14" is composed of a semiconductor other than silicon.

By achieving such siliconizing, or more generally by the presence of the area composed of metal and of semiconductor at the surface of the remaining portions 14' and 14", the adherence of the adhesion layer 18 on these portions 14' and 14" is improved. Preferably, this siliconizing may be applied in situ, i.e. carried out in the piece of equipment used for achieving deposition of the adhesion layer 18, without applying other steps between the step for making the metal and semiconductor area and the deposition of the adhesion layer 18, with which the siliconized area cannot be exposed to the outside environment and better adherence properties of the latter towards the adhesion layer 18 may thus be preserved.

In an alternative, it is also possible to first of all achieve deposition of an anti-reflective layer and/or other layers onto the face of the substrate 2 including the remaining portions 14', 14", and then to deposit the adhesion layer 18 on this anti-reflective layer and/or on the other layers.

The adhesion layer 18 may for example have a thickness comprised between about 100 nm and 1 μm.

It is then possible to perform a surface treatment of the adhesion layer 18 for example mechanochemical polishing with which possible roughness of the substrate 2 which may be found at the upper face of the adhesion layer 18 may be removed. With this polishing, it is thereby possible to obtain a planar surface.

An assembly 16 is thereby obtained, here formed by the substrate 2, the remaining portions 14', 14" of the layer 14, the remaining portions 12', 12" of the adherence layer 12 and the adhesion layer 18 including the pattern of the graphic element which one wishes to transfer onto the support 20 of the object 100.

In parallel with the making of the assembly 16, the support 20 may be prepared for receiving the transfer of the assembly 16.

Figure 1G:
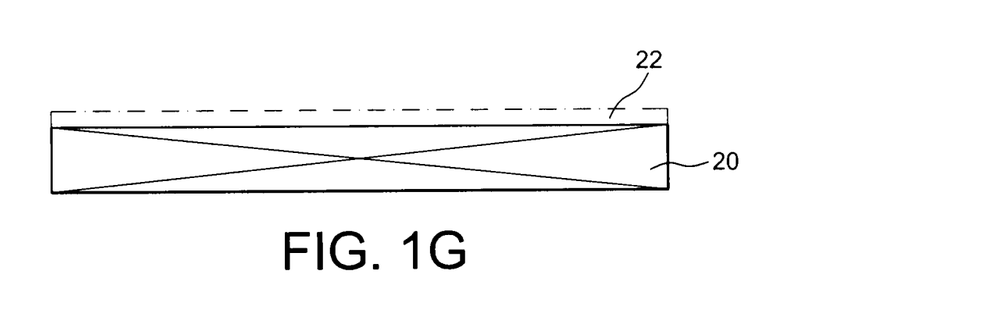

For this, as illustrated in FIG. 1G, an adhesion layer 22 is for example deposited via deposition of the CVD or PVD type, on a face of the support intended to receive the assembly 16. This adhesion layer 22 may be composed of a mineral material such as silicon dioxide or silicon nitride, and/or of a nature similar to that of the adhesion layer 18. The material of the adhesion layer 22 is notably selected so as to be able to subsequently achieve bonding by molecular adhesion with the assembly 16 and more particularly with the adhesion layer 18. It is also possible to cover the other faces of the support 20 with the material of the adhesion layer 22 in order to achieve mechanical protection of the support 20 during the subsequent steps of the method.

Figure 1H:
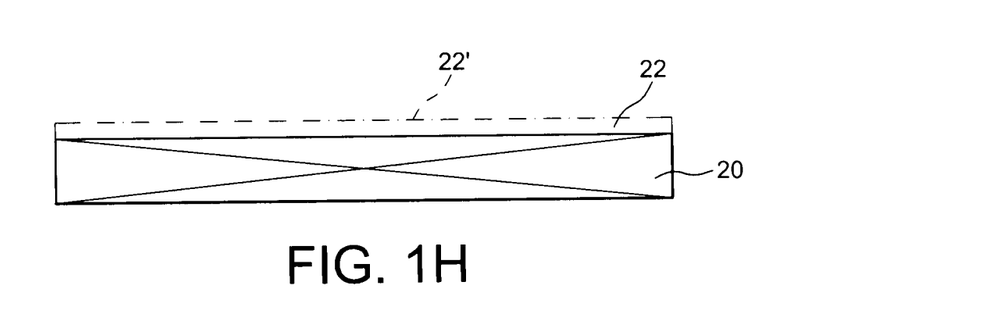

A surface treatment of the adhesion layer is then carried out, for example mechanochemical polishing of the surface 22' of the adhesion layer 22, with which possible roughness of the support 20 which may be found at the face 22' of the adhesion layer 22 may be removed and a planar surface may thereby be obtained (FIG. 1H).

Figure 1I:
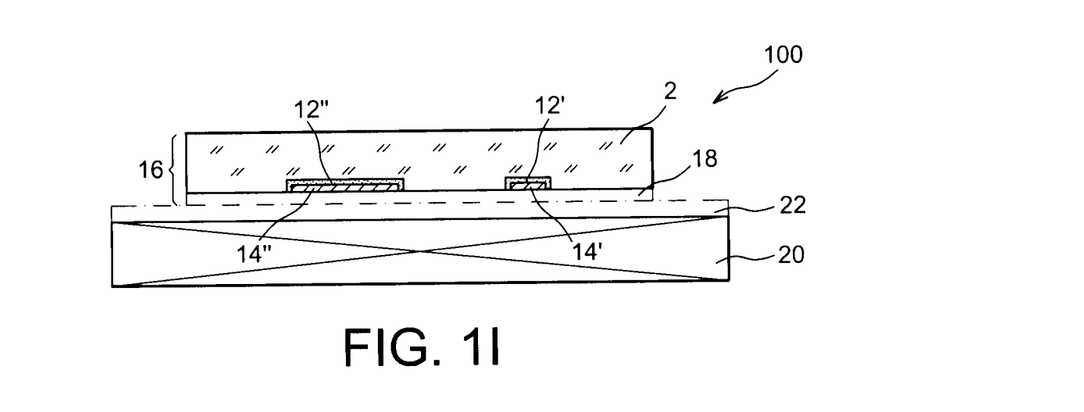

Finally, as illustrated in FIG. 1I, the assembly 16, or a portion of the assembly 16, including the graphic element, is transferred onto the support 20 by achieving bonding by molecular adhesion, without supplying any material. In the embodiment described here, bonding by molecular adhesion is achieved between the adhesion layer 22 and the adhesion layer 18 which here are composed of the same material. Bonding by molecular adhesion is achieved between both planar faces of the adhesion layers 18 and 22. When the support 20 is composed of a material which may achieve bonding by molecular adhesion with the adhesion layer 18, the adhesion layer 22 may be omitted. Also, it is also possible to achieve bonding by molecular adhesion directly between the support 20 and the face of the substrate 2 including the remaining portions 14', 14" and possibly the portions 12' and 12" if the nature of these materials and the roughnesses of the faces allow this. The roughnesses of the surfaces bonded by molecular adhesion may notably be less than about 1 nm or 0.5 nm.

A step for heat treatment of the object (support+transferred assembly) may then be performed allowing consolidation of the achieved molecular adhesion. This heat treatment may notably be annealing carried out at a temperature comprised between about 250° C. and 1,200° C. Advantageously, this annealing may be carried out at a temperature greater than about 850° C. in order to obtain robustness as best as possible at the interface of the molecular collage adhesion (at least equivalent to that of a massive material).

The object 100 including the graphic element formed by the portions 12', 12", 14', 14" visible through the substrate 2 and embedded in the thereby formed monolithic structure, is thereby obtained.

A method for making an object 200 including a graphic element made on a support 20, for example a massive object such as a jewel, a watch, an electronic equipment, or further a medium for preserving information, will be described in connection with FIGS. 2A-2I. In this second embodiment, the object 200 is a jewel, the graphic element of which is made on a thin layer of the same nature as the support 20 which here is a precious stone, for example a diamond.

Figure 2A:
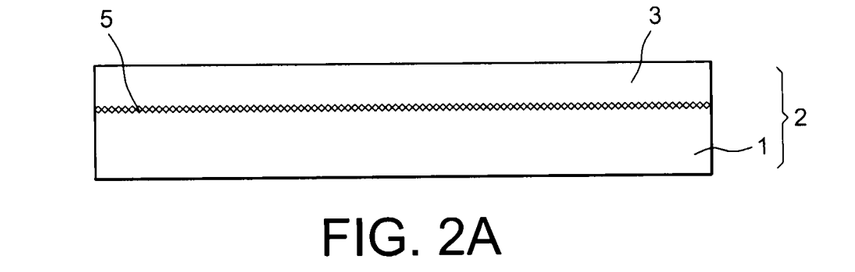
FIGS. 2A-2I illustrate the steps of a method for making an object provided with a graphic element according to a second embodiment of the present invention.

As illustrated in FIG. 2A, a substrate 2 including a thin, for example transparent or at least partly transparent layer 3 formed on a massive substrate is made. This thin layer 3 for example has a thickness of less than about 1 μm and is composed of an amorphous or crystalline material, for example of the diamond, sapphire type, or more generally of the precious or semi-precious stone type. The thin layer 3 is for example obtained by deposition of the CVD or PVD type on the massive substrate 1. The massive substrate 1 may for example be composed of silicon or of any other material, for example a crystalline material, which can receive the thin layer 3. A fracture interface 5 is then made for example by ion implantation, at the interface between the thin layer 3 and the massive substrate 1. The thickness of the support 20 (illustrated in FIGS. 2F-2I) may notably be greater than or equal to about 100 μm.

In an alternative, the substrate 2 may be obtained by carrying out a specific treatment by ion implantation in a material, for example a crystalline material, forming a fracture area 5 which delimits a first portion of the material forming the thin layer 3 and a second portion of the material forming the massive substrate 1.

Figure 2B:
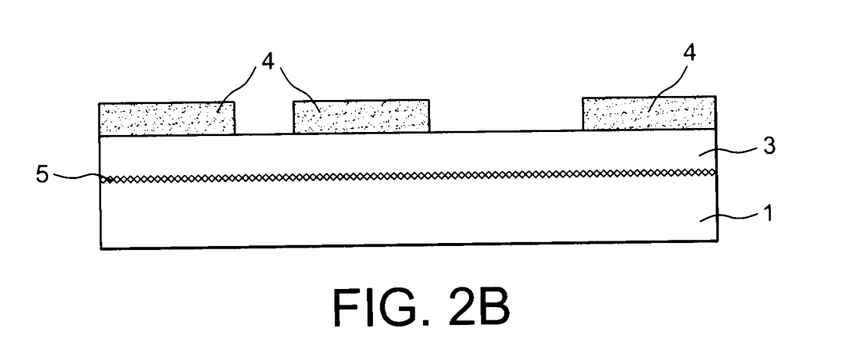
Figure 2C:
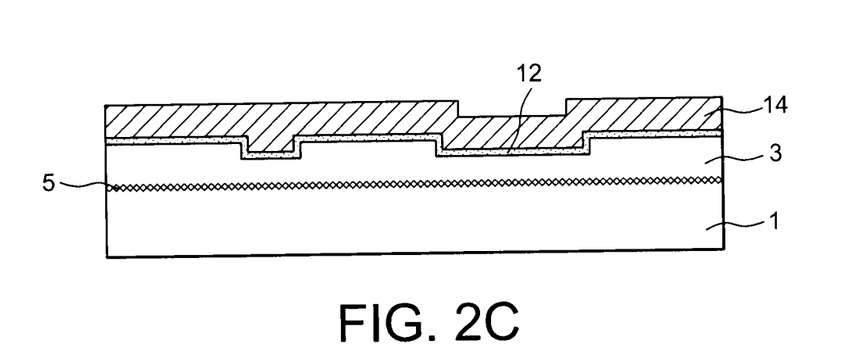

In FIG. 2B, like in the first embodiment described earlier, a mask 4 is then made on a face of the thin layer 3, the pattern of which corresponds to that of the graphic element to be made, from a photosensitive resin layer deposited on the thin layer 3 and one or more lithographic or etching steps.

The face of the thin layer 3 on which is made the mask 4 is then etched via an isotropic or anisotropic or dry chemical route (plasma mode, reactive ion etching or ion machining) forming recesses, the pattern of which complies with that of the graphic element. The etching mask 4 is then removed. The pattern of the graphic element is therefore transferred into the thin layer 3.

In an alternative embodiment, the mask 4 may also be formed in a layer of the mineral type or composed of metal, as described earlier in connection with an alternative of the first embodiment. In another alternative, it is also possible not to use any etching mask and to produce the pattern of the graphic element by laser ablation.

Next, deposition of an adherence layer 12 and of a layer 14 as for the first embodiment described above (see FIG. 2C) is carried out.

Figure 2D:
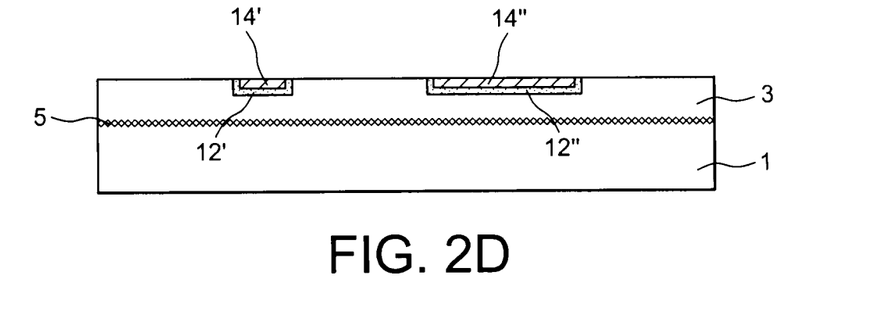

As illustrated in FIG. 2D, mechanochemical polishing of the layer 14 and of the adherence layer 12 is then carried out, with stop on the face of the thin layer 3 on which the layers 12 and 14 have been deposited. Portions 12', 12" of the adherence layer 12 and portions 14', 14" of the layer 14 positioned in the recesses made earlier in the thin layer 3 are thereby preserved. These remaining portions 12', 12" and 14', 14" therefore form the pattern of the graphic element which one wishes to make. This face of the thin layer 3 may then be treated.

Like in an alternative described in connection with the first embodiment, the layer 14 may be deposited onto the thin layer 3 and in the recesses formed in the thin layer 3 without depositing beforehand any adherence layer 12 onto the thin layer 3. The thickness of the deposited layer 14 may in this case be greater than the depth of the recesses 6. As described earlier, mechanochemical polishing of the deposited layer 14 is then carried out in order to only preserve the portions 14', 14" deposited in the recesses 6.

Figure 2E:
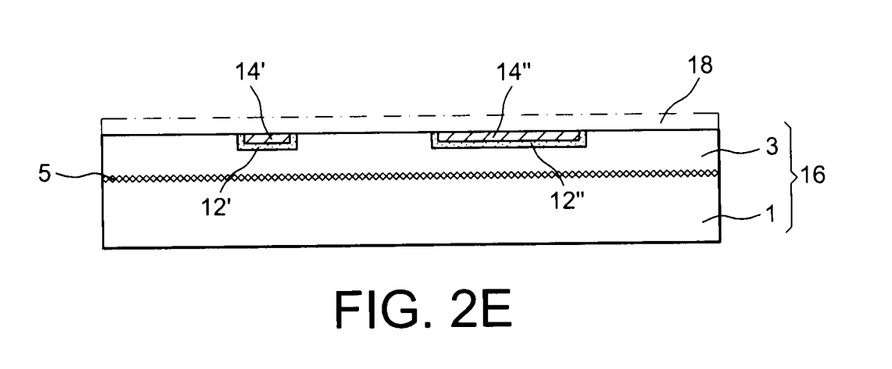

An adhesion layer 18, for example similar to the one described earlier in connection with the first embodiment, is then deposited, for example by CVD or PVD, onto the face of the thin layer 3 including the portions 12', 12", 14', 14" deposited in the recesses (FIG. 2E).

Like for the first embodiment, prior to depositing the adhesion layer 18, it is possible to form at the surface portions 14' and 14" of areas composed of metal and semiconductor, for example composed of silicide, when the portions 14' and 14" are composed of metal, in order to improve the adherence of the adhesion layer 18 on these portions 14', 14".

It is also possible to first of all carry out deposition of an anti-reflective layer and/or other layers onto the face of the thin layer 3 including the remaining portions 14', 14", and to then deposit the adhesion layer 18 onto the anti-reflective layer and/or onto the other layers.

An assembly 16 is thereby obtained, here formed by the substrate 2, i.e. the massive substrate 1 and the thin layer 3, the remaining portions 14', 14" of the layer 14, the remaining portions 12', 12" of the adherence layer 12 and the adhesion layer 18, including the pattern of the graphic element which one wishes to transfer onto the support 20 of the object 200.

In parallel with the making of the assembly 16, the support 20 may be prepared in order to receive the transfer of the assembly 16.

Figure 2F:
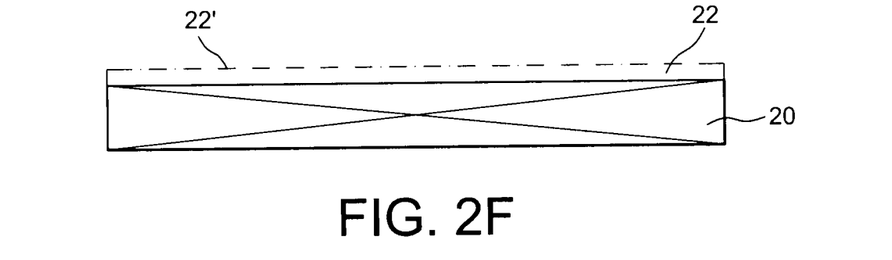
Figure 2G:
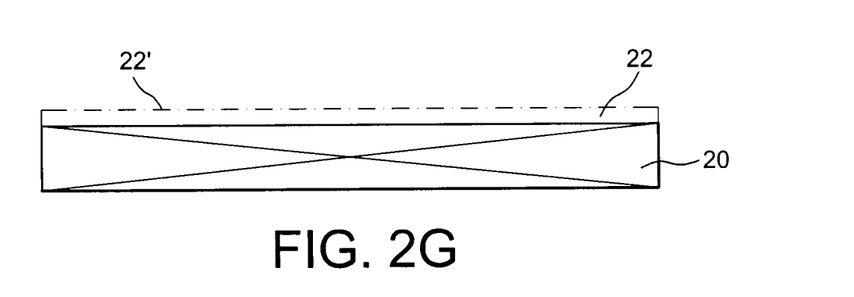

For this, as illustrated in FIG. 2F, an adhesion layer 22, for example similar to the one described in connection with the first embodiment, is deposited, for example by deposition of the CVD or PVD type, onto a face of the support 20 intended to receive the assembly 16. It is also possible to cover the other faces of the support 20 with the material of the adhesion layer 22 in order to achieve mechanical protection of the support 20 during subsequent steps of the method.

A surface treatment of the adhesion layer is then carried out for example mechanochemical polishing of the surface 22' of the adhesion layer 22, by which the possible roughness of the support 20 which may be located at the face 22' of the adhesion layer 22 (FIG. 2G) may be removed.

Figure 2H:
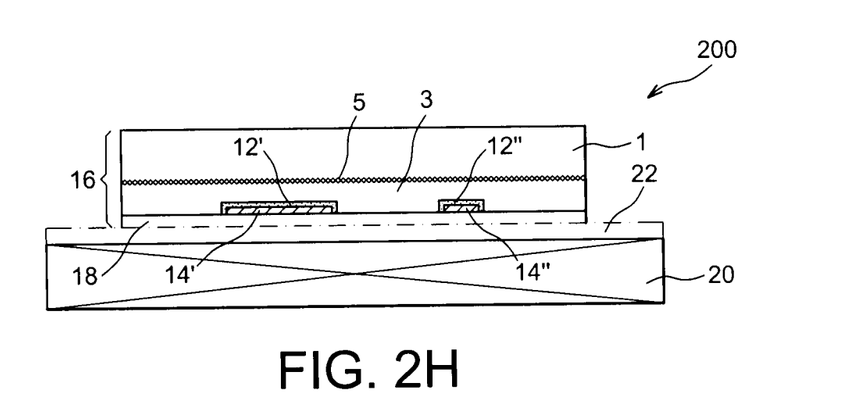

As illustrated in FIG. 2H, the assembly 16, or a portion of the assembly 16, including the graphic element, is transferred onto the support 20 by achieving bonding by molecular adhesion, without supplying any material. In the second embodiment described here, the bonding by molecular adhesion is carried out between the adhesion layer 22 and the adhesion layer 18 which are here composed of the same material. When the support 20 is composed of a material which may achieve bonding by molecular adhesion with the adhesion layer 18, the adhesion layer 22 may be omitted. Moreover, it is also possible to achieve bonding by molecular adhesion directly between the support 20 and the face of the thin layer 3 including the remaining portions 14', 14" and possibly the portions 12' and 12" if the nature of these materials and the roughnesses of the faces allow this. The roughnesses of the bonded surfaces by molecular adhesion may notably be less than about 1 nm or 0.5 nm.

A step for heat treatment of the object (support+added assembly) may then be carried out with which the achieved molecular adhesion may be consolidated and the fracture between the massive substrate 1 and the thin layer 3 may be achieved along the fracture interface 5. This heat treatment may notably be annealing carried out at a temperature comprised between about 250° C. and 1,200° C.

Figure 2I:
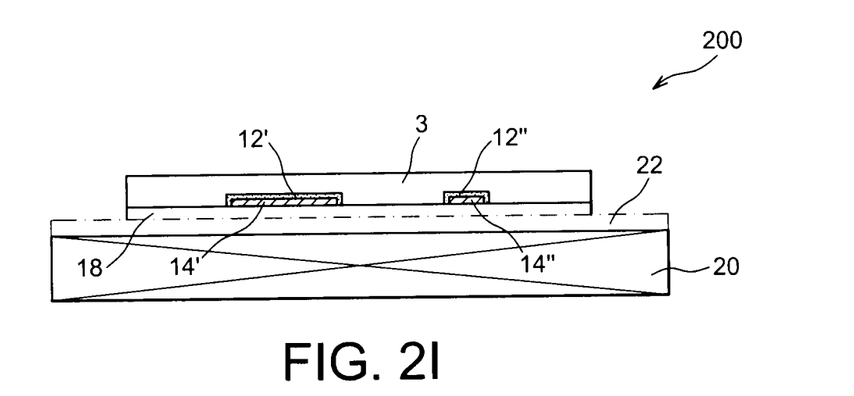

The object 200 is thereby obtained, including the graphic element formed by the portions 12', 12", 14', 14" visible through the thin layer 3 and embedded in the thereby formed monolithic structure, as shown in FIG. 2I.

It is finally possible to carry out mechanochemical polishing of the thin layer 3 by which the optical properties, i.e. the visibility of the graphic element, may be improved.

The invention claimed is:

1. An object comprising:
   at least one at least partly transparent substrate having a thickness less than or equal to 10 μm or between 100 μm and 1 mm, at least one face of which comprises recesses forming a pattern of a graphic element completely filled with at least one material having a thickness between 50 nm and 100 nm,
   the at least one face of the at least one at least partly transparent substrate comprising the recesses being fixed to at least one face of at least one support by molecular adhesion, the at least one at least partly transparent substrate and the at least one support forming a monolithic structure in which the graphic element is hermetically sealed,
   a roughness of surfaces bonded by molecular adhesions is less than about 1 nm, and
   an adherence material in a recess between the at least one material and the at least one at least partly transparent substrate.

2. The object according to claim 1, wherein the at least one material positioned in the recesses comprises at least one mineral material.

3. The object according to claim 1, wherein the adherence material comprise at least one metal, a metal nitride, or a metal oxide.

4. The object according to claim 1, further comprising a first adhesion layer connected by molecular adhesion to the at least one support.

5. The object according to claim 4, wherein the first adhesion layer comprises at least one mineral material.

6. The object according to claim 4, wherein the material in the recesses includes a compound formed from a metal and a semiconductor material, and said compound is at a face of the material not in direct contact with a bottom of the recesses.

7. The object according to claim 6, wherein the compound is a silicide.

8. The object according to claim 1, wherein the object is a jewel, a stone, a watch, an electronic device, or a data medium.

9. The object according to claim 1, wherein the at least one at least partly transparent substrate comprises at least one amorphous or crystalline material.

10. The object according to claim 2, wherein the at least one at least partly transparent substrate comprises at least one amorphous or crystalline material.

11. The object according to claim 1, further comprising an adhesion layer positioned between the at least one face of the at least one at least partly transparent substrate comprising the recesses and the at least one support, the adhesion layer being connected by molecular adhesion to the at least one face of the at least one at least partly transparent substrate comprising the recesses.

12. The object according to claim 1, further comprising a first adhesion layer and a second adhesion layer positioned between the at least one face of the at least one at least partly transparent substrate comprising the recesses and the at least one support, the first adhesion layer being connected by molecular adhesion to the second adhesion layer.

* * * * *